US008583857B2

(12) United States Patent
Wu et al.

(10) Patent No.: US 8,583,857 B2
(45) Date of Patent: Nov. 12, 2013

(54) METHOD AND SYSTEM FOR OBJECT-ORIENTED DATA STORAGE

(75) Inventors: Zining Wu, Los Altos, CA (US); Xueshi Yang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 412 days.

(21) Appl. No.: 12/964,971

(22) Filed: Dec. 10, 2010

(65) Prior Publication Data

US 2011/0082976 A1 Apr. 7, 2011

Related U.S. Application Data

(63) Continuation-in-part of application No. 12/184,630, filed on Aug. 1, 2008.

(60) Provisional application No. 61/290,106, filed on Dec. 24, 2009, provisional application No. 60/965,409, filed on Aug. 20, 2007.

(51) Int. Cl.
*G06F 12/00* (2006.01)

(52) U.S. Cl.
USPC ........................................................ 711/103

(58) Field of Classification Search
None
See application file for complete search history.

(56) References Cited

U.S. PATENT DOCUMENTS

| | | | |
|---|---|---|---|
| 5,541,886 A | 7/1996 | Hasbun | |
| 5,859,795 A | 1/1999 | Rolandi | |
| 6,466,476 B1 | 10/2002 | Wong et al. | |
| 6,728,133 B2 | 4/2004 | Shimizu | |
| 8,046,525 B2 * | 10/2011 | Chae et al. | 711/103 |
| 2003/0007384 A1 | 1/2003 | Shimizu | |
| 2003/0053333 A1 | 3/2003 | Rudelic et al. | |
| 2005/0052934 A1 | 3/2005 | Tran et al. | |
| 2006/0095793 A1 | 5/2006 | Hall | |
| 2007/0025151 A1 | 2/2007 | Lee | |
| 2007/0050642 A1 | 3/2007 | Flynn et al. | |
| 2007/0156659 A1 | 7/2007 | Lim | |
| 2007/0266291 A1 | 11/2007 | Toda et al. | |

(Continued)

FOREIGN PATENT DOCUMENTS

| | | |
|---|---|---|
| EP | 0 788 113 | 8/1997 |
| EP | 2 028 661 | 2/2009 |
| WO | WO03/025948 | 3/2003 |
| WO | WO2007/037757 | 4/2007 |

OTHER PUBLICATIONS

Qun, L., et al., "An approach to attribute-based object access", *J. Huazhong Univ. of Sci. & Tech.* (*Nature Science Edition*), vol. 34, No. 12, Dec. 31, 2006.

*Primary Examiner* — Brian Peugh

(57) ABSTRACT

In accordance with the present invention, data may be written and read differently in accordance with their attributes, which may include, inter alia, critical vs. non-critical data, streaming vs. non-streaming media, confidential vs. non-confidential, or read or write speed requirements. A data block to be written may be considered an object, and is examined, and from its attributes one or more memory device operating modes may be determined, such as different numbers of bits per cell, different numbers of error-correction code (ECC) parities per user data block, and encryption vs. lack of encryption. The storage controller then performs the writing process according to the mode(s) of operation determined by the attributes. Respective designated portions of the storage device may be selectively operated in respective ones of a plurality of operating modes to process each of the plurality of data objects based on a corresponding one or more of the attributes.

12 Claims, 13 Drawing Sheets

(56) References Cited

U.S. PATENT DOCUMENTS

| | | |
|---|---|---|
| 2008/0002468 A1 | 1/2008 | Hemink |
| 2008/0072120 A1 | 3/2008 | Radke |
| 2008/0189473 A1* | 8/2008 | Murray ........................ 711/103 |
| 2008/0215801 A1 | 9/2008 | Tan et al. |
| 2008/0313493 A1 | 12/2008 | Roohparvar et al. |
| 2009/0080247 A1 | 3/2009 | Lasser |
| 2009/0193184 A1 | 7/2009 | Yu et al. |
| 2011/0082976 A1* | 4/2011 | Wu et al. ........................ 711/114 |
| 2012/0159054 A1* | 6/2012 | Cheon et al. .................. 711/103 |

\* cited by examiner

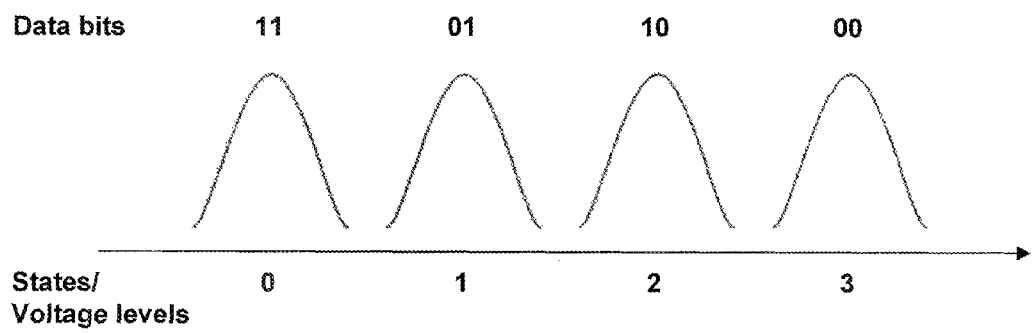
FIG. 1
FIG. 2
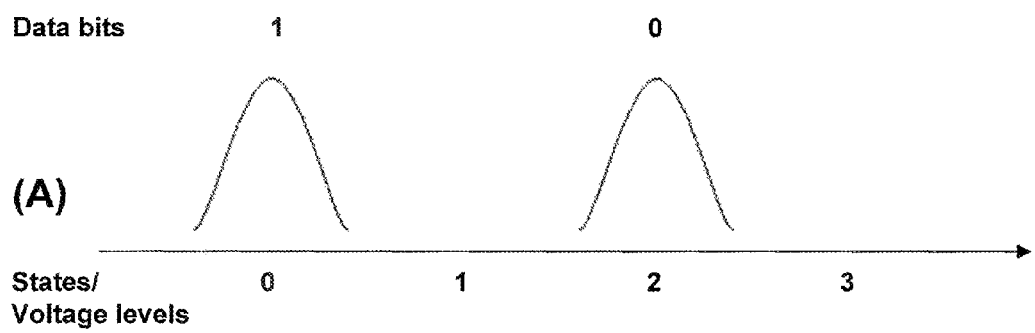
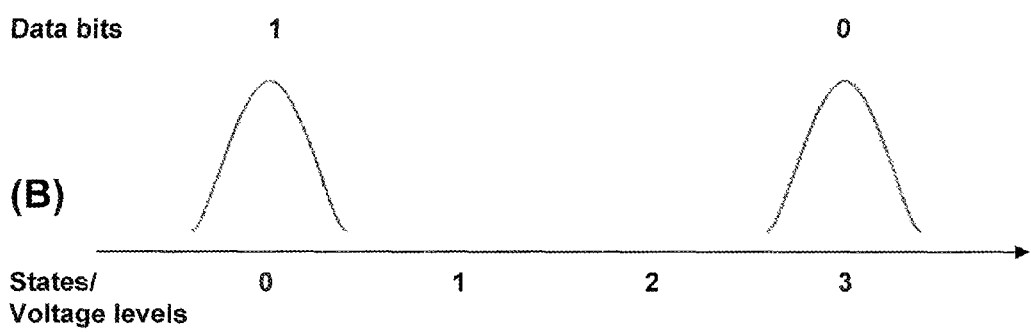
FIG. 3

METHOD AND SYSTEM FOR OBJECT-ORIENTED DATA STORAGE

CROSS REFERENCE TO RELATED APPLICATIONS

This claims the benefit of copending, commonly-assigned U.S. Provisional Patent Application No. 61/290,106, filed Dec. 24, 2009, and is a continuation-in-part of copending commonly-assigned U.S. patent application Ser. No. 12/184,630, filed Aug. 1, 2008, which claims the benefit of copending, commonly-assigned U.S. Provisional Patent Application No. 60/965,409, filed Aug. 20, 2007. Each of the aforementioned applications is hereby incorporated by reference herein in its respective entirety.

BACKGROUND

This invention relates to a method and system for using a storage device that has multiple operating modes, and particularly to a method and system for reading and writing data from and to such a storage device according to attributes of the data.

Data to be stored can have different attributes, including, inter alia, different required levels of reliability and/or integrity, different required read and write speeds, different expected access frequency, and different required security levels. These attributes may be imposed or expected by the user, or by user software.

Heretofore, data once presented to a storage device or system were all treated the same way absent user intervention. For example, data requiring encrypted storage had to be processed by the user through an encryption program. Moreover, on a magnetic hard disk, for example, all data have been physically written and read the same way regardless of their attributes.

SUMMARY

In accordance with the present invention, data may be written and read differently in accordance with their attributes. The handling of the attributes may take advantage of characteristics of the particular form of storage technology being used. The various modes in which multi-level flash memory, in particular, can be operated may include, inter alia, different numbers of bits per cell, different numbers of error-correction code (ECC) parities per user data block, and encryption vs. lack of encryption. Therefore, multi-level flash memory is capable of providing trade-offs between reliability, speed, endurance and capacity, depending on the mode in which it is operated. More specifically, the greater separation between levels when the memory is operated in a mode in which fewer bits per cell are used allows faster reading and writing, and/or higher reliability, and/or greater endurance (i.e., ability to undergo large numbers of read/write cycles without perturbing the data not being read or written, as well as overall lifetime read/write cycles before device failure). However, operating in one of the latter modes would require a compromise or trade-off in terms of overall storage capacity available.

The decision as to which mode in which to operate may be made at the storage controller level by treating blocks of data as objects, and examining the attributes of those objects. The attributes may be stored with the data or in a separate table or other separate storage. For example, when a block of data is presented to be written, the block may include a header identifying the type of data. The controller can read that header, consult a look-up table to determine how that type of data is handled, and adjust the write process accordingly as described below. When data are to be read, the controller can consult a different look-up table based on the address it has been asked to read to determine the type of data stored at that address so that it can be read in the proper mode, according to how it was originally written. Alternatively, in some embodiments the type of data can be stored with the data themselves, although that would require that the header of each stored block always be stored in the same format regardless of how the rest of the block is stored.

Taking the requirement for encryption as one type of attribute, the handling of this particular attribute—encryption—is not dependent on any particular type of storage device technology, but works equally well with, e.g., both magnetic disk storage and nonvolatile solid-state storage such as flash memory.

An embodiment of the invention has dedicated areas of the memory device for different kinds of data that may have different speed, reliability, security, etc., requirements. For example, the most-significant-bit portion of each memory page can be used for data having greater speed, reliability, security, etc., requirements, while the least-significant-bit portion of each memory page can be used for less demanding data; or the least-significant-bit portion and most-significant-bit portion can be reversed for this purpose. The device portion storing the page portion designated for the data having greater speed, reliability, security, etc., requirements can be operated in a one-bit-per-cell mode while the device portion storing the page portion designated for other data can be operated in a multi-level mode (e.g., two bits per cell). As another possibility, a device can be constructed with a single-level cell portion for data requiring greater speed, reliability, security, etc. and multi-level cell (e.g., two bits per cell) portion for other data.

Therefore, in accordance with an embodiment of the present invention, a method for storing data in a storage device includes determining one or more attributes associated with each of a plurality of data objects, and selectively operating respective designated portions of the storage device in respective ones of a plurality of operating modes to process each of the plurality of data objects based on a corresponding one or more of the attributes.

In accordance with another embodiment, a memory device includes a storage medium having respective portions designated to operate in respective ones of a plurality of operating modes, and a controller for examining one or more attributes of a data object to be stored and for writing the data object to one of the respective portions of the storage medium in one of the modes according to the one or more attributes.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which:

FIG. 1 is a representation of data storage levels in a multi-level flash memory;

FIG. 2 is a representation of data storage levels in a multi-level flash memory in which fewer than all levels are used according to one embodiment of the present invention;

FIG. 3 is a representation of data storage levels in a multi-level flash memory in which fewer than all levels are used according to another embodiment of the present invention;

DETAILED DESCRIPTION

Figure 4:
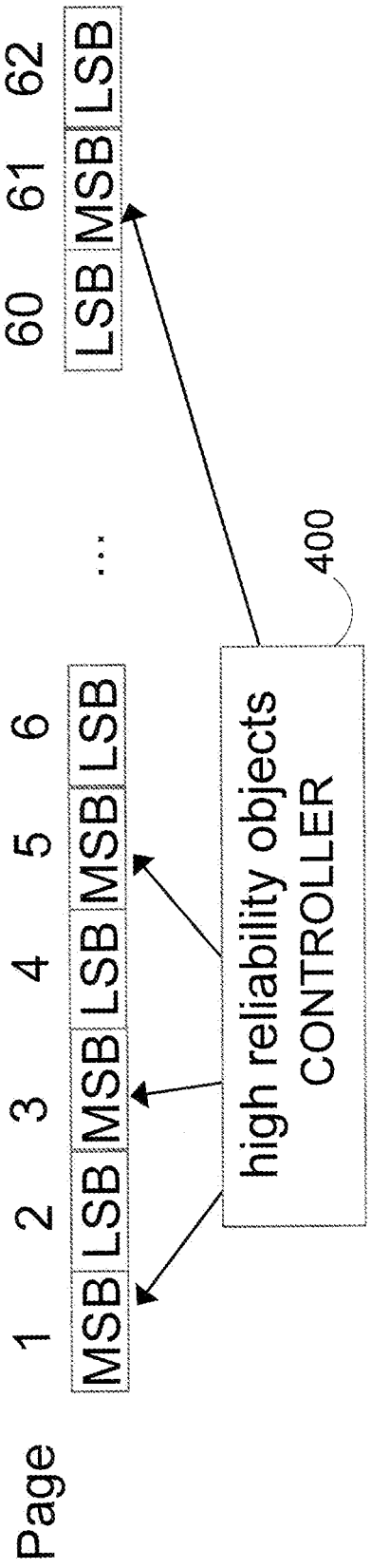
FIG. 4 is a representation of data storage by page portions according to attributes of the data.

As stated above, the present invention relies on the ability of different types of storage to operate in different modes. Thus, while a conventional magnetic hard disk operates in a binary mode, multi-level flash memory, to take just one example, may operate at n bits per cell, resulting in $2^n$ possible states. However, one could elect to use a mode in which there are fewer than $2^n$ states. For example, four-bit-per-cell memory could be operated as any one of one-bit, two-bit or four-bit memory, while as another example, two-bit-per-cell memory could operate as one-bit memory. Other selectable modes of operation of various types of memory may include the number of error-correction coding (ECC) parities per data block, and encrypted vs. unencrypted operation.

Similarly, the kinds of attributes that may be assigned to a data object may include critical vs. non-critical data, streaming vs. non-streaming media, confidential vs. non-confidential, read/write speed requirements, reliability requirements, integrity requirements, expected access frequency and/or required security level. While these are just examples, and there may be other attributes that dictate particular modes of operation, considering these examples is illustrative. For example, if the data are confidential, that might dictate that encryption mode be used. If the data are critical, that might dictate that fewer bits be stored per cell, as discussed below. If the data are streaming media, or otherwise have high speed requirements, that might dictate not only that fewer bits be stored per cell, but also that fewer ECC parities be included in each data block.

These examples may be explained with reference to a multi-level flash memory. Although the present invention may be used with other types of memory, multi-level flash memory is particularly well-suited to the present invention, because the number of bits per cell affects how the data are stored physically, providing flexibility in storage that may not be found in other types of memory devices.

As an example of multi-level flash memory, two-bit-per-cell flash memory can provide a simple example. FIG. 1 shows the threshold voltage distribution as a function of state, correlated to the binary data represented by each of four states 0-3. In this example, state 0 represents data 11b, state 1 represents data 01b, state 2 represents 10b, and state 4 represents 00b. As shown in FIGS. 2 and 3, two of the four states can be eliminated, providing one-bit-per-cell operation.

In FIG. 2, states 1 and 3 are unused, with state 0 representing 1b and state 2 representing 0b (although the reverse also could be true). This increases the margin between states, allowing a lower programming voltage and decreased stress on the device. This in turn provides faster read/write operation (because bigger margins between states allow longer pulses), higher reliability (because of larger margins between states), and more endurance (because the decreased stress allows the device to endure more read/write cycles without perturbing data previously written or without failing as soon). The trade-off for all these advantages is that the maximum storage capacity is not available. However, for different applications, one of the other foregoing factors may be more important than storage capacity.

Similarly, in FIG. 3, states 1 and 2 are unused, with state 0 representing 1b and state 3 representing 0b (although the reverse also could be true). This increases the margin between states even more than in the embodiment of FIG. 2. The advantages of the embodiment of FIG. 3 over normal operation are similar to the advantages of the embodiment of FIG. 2. While both the embodiments of FIGS. 2 and 3 provide the same trade-off in terms of capacity, there also is a trade-off as between the two embodiments in terms of the factors related to stress, such as endurance.

In a system utilizing the invention, it is possible that the entire memory structure is used in a single mode—e.g., a two-bit per-cell memory will be operated in its entirety as a one-bit-per-cell memory. Alternatively, different parts of the memory may operate in different modes—e.g., cells of a two-bit-per-cell memory may operate either in one-bit or two-bit mode. In the latter case, the different modes may be accommodated by static or dynamic allocation.

In a static allocation, a memory device may be divided into different regions, with every cell in a region operating in the same mode. Thus, a two-bit-per-cell flash memory device could have one region in which each cell operates in the native two-bit-per-cell mode and another region in which each cell operates in a one-bit-per-cell mode. On the other hand, in a dynamic allocation, the mode of each cell changes in accordance with the requirements or characteristics of the data to be stored in that cell.

A static allocation embodiment requires more processing for write operations and less processing for read operations. For example, during reading, the system will call for data at a certain address. That address will have been allocated in advance to one particular storage mode. Therefore, no additional processing will be required to determine the mode before the data can be read. On the other hand, during writing, each data block to be written will be examined to determine its attributes, and the correct mode will be determined from those attributes as defined by the system according to that embodiment. The system will then look up which cells are allocated to that mode, and write the data to one or more of those cells.

A dynamic allocation uses more processing for read operations and less processing for write operations. For example, during writing, each data block to be written will be examined to determine its attributes, and the correct mode will be determined from those attributes as defined by the system according to that embodiment. The system will then write to any available cell using the correct mode. On the other hand, during reading, the system will call for data from a particular address. Because the address has not been correlated in advance with a particular mode, the mode in which the data were stored is determined before the data can be read. This can be done in several ways. For example, a separate look-up table can be maintained, which the system can update each time it writes data and then examine each time it needs to read data. Alternatively, information regarding the mode can be stored in a header with the data themselves. This would mean that a header is stored in a predetermined mode—e.g., the native mode of the memory device—regardless of the mode in which the data themselves are actually stored. The system would read the header in the predetermined mode and then switch to the indicated mode to read the actual data.

Actual hardware/firmware changes to the memory device may not be required to implement the different modes. For example, in the case where the different modes relate to the number of bits per cell, the native coding scheme included in the hardware/firmware of the device could be used. Taking the aforementioned case of two-bit-per-cell memory being used as one-bit-per-cell memory as an example, the actual storage of the data can be accomplished in the native mode, with a transformation applied before writing and after reading, as follows:

| States Used | Read/ Write | Original Datum | Transformed Datum |
| --- | --- | --- | --- |
| 0, 2 | W | 1 | 00 |
|  |  | 0 | 10 |
|  | R | 00 | 1 |
|  |  | 10 | 0 |
| 0, 3 | W | 1 | 00 |
|  |  | 0 | 11 |
|  | R | 00 | 1 |
|  |  | 11 | 0 |

This transformation allows some error correction "on the fly," because if data are present representing states that are not being used, one can have a high degree of confidence that those data are in error and appropriate error correction can be performed.

If optional error-correction coding (ECC) is used, this transformation may be applied after ECC encoding and data packing on the write side, and before ECC encoding and data packing on the read side.

It should be noted that while an example of two-bits-per-cell (four levels) has been discussed herein, the invention has applicability to memory devices capable of any number of bits per cell. For example, at four-bits-per-cell, there are sixteen levels, and different numbers of those levels may be appropriate for different attributes.

The invention can be used to select a lower-number-of-bits-per-cell mode if, for example, the data object is critical (i.e., has a high reliability requirement).

As discussed above, other data modes can be selected according to the data object attributes. For example, for confidential data objects, encryption mode can be turned on. For data objects that require superior reliability (e.g., operating system files), the number of parities per data block can be selected to be larger than other data. In addition, these objects can be stored in memory operating at a low-number-of-bits-per-cell mode—e.g., the one-bit-per-cell mode—which allows longer programming pulses, and therefore more accurate writing.

According to another embodiment of the invention, different pages of each data block can have different characteristics, which may give them different levels of, e.g., throughput or reliability. For example, the controller can use selected data pages in a data block to realize different requirements of data throughput or reliability. In one such implementation, the most-significant-bit data pages (or the least significant bit data pages, depending on the design) can be designed to have significantly higher reliability and/or speed/throughput than the other pages (i.e., the least-significant-bit pages or the most-significant-bit pages, respectively). In such an embodiment or implementation, the device portion storing the page portion designated for the data requiring greater speed, reliability, security, etc. can be operated in a one-bit-per-cell mode while the device portion storing the page portion designated for other data can be operated in a multi-level mode (e.g., two bits per cell). The controller 400 simply stores the data that require the higher reliability in the appropriate pages (MSB or LSB as the case may be), as shown schematically in FIG. 4. In that FIGURE, odd-numbered pages 1, 3, 5, . . . , 61 may be used (corresponding to MSB pages) for objects requiring high reliability, while the LSB pages 2, 4, 6, . . . , 62 (corresponding to LSB pages) may be used for other objects.

Figure 5:
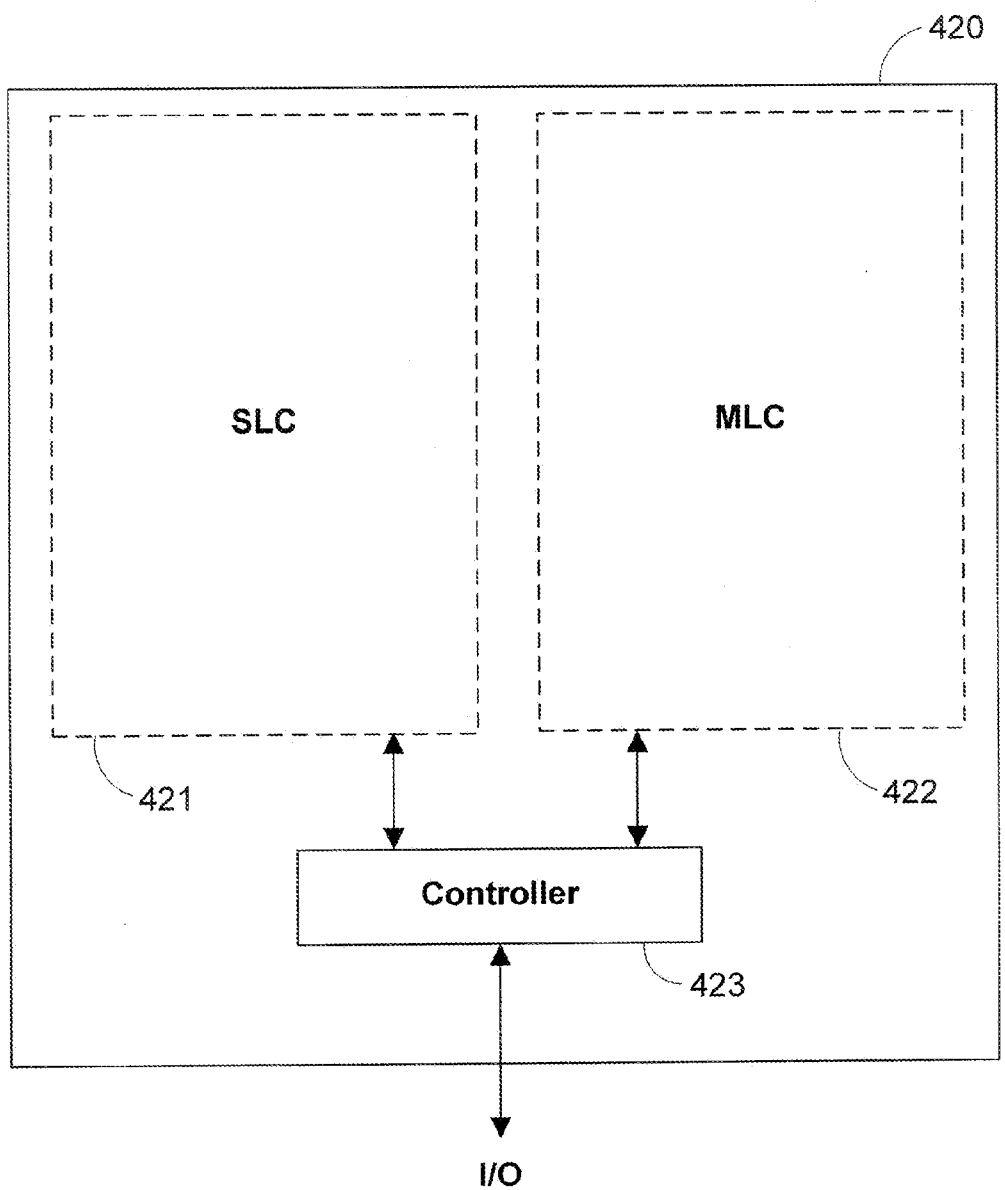
FIG. 5 is a representation of a hybrid data storage device including a single-level memory cell array and a multi-level memory cell array.

Alternatively, embodiments of "object-oriented" non-volatile memory within the present invention may be implemented using "hybrid" devices which include more than one region, where each region is made from memory (e.g., flash memory) that is designed at the time of its manufacture to store one particular number of bits per cell, as shown in FIG. 5. For example, one can integrate an SLC (single-level charge—i.e., one-bit-per-cell) device 421 and an MLC (multi-level charge e.g., two-bit-per-cell) device 422 into a single memory device 420. Data requiring higher reliability or higher throughput (e.g., streaming media data as compared to non-streaming media data), or that otherwise are more critical, would be stored in the SLC portion 421 which is more reliable. The controller 423 would direct the data to the appropriate portion 421, 422 of the device 420 according to the object attributes of the data, but would not need to change the mode of operation of any portion 421, 422 of the device 420 from its native mode of operation. Thus, the number of bits stored in each cell would not change in response to the controller 423. Other features such as stronger ECC, data encryption, etc., can also be applied to the appropriate portion 421, 422 to realize "object" attributes.

Figure 6:
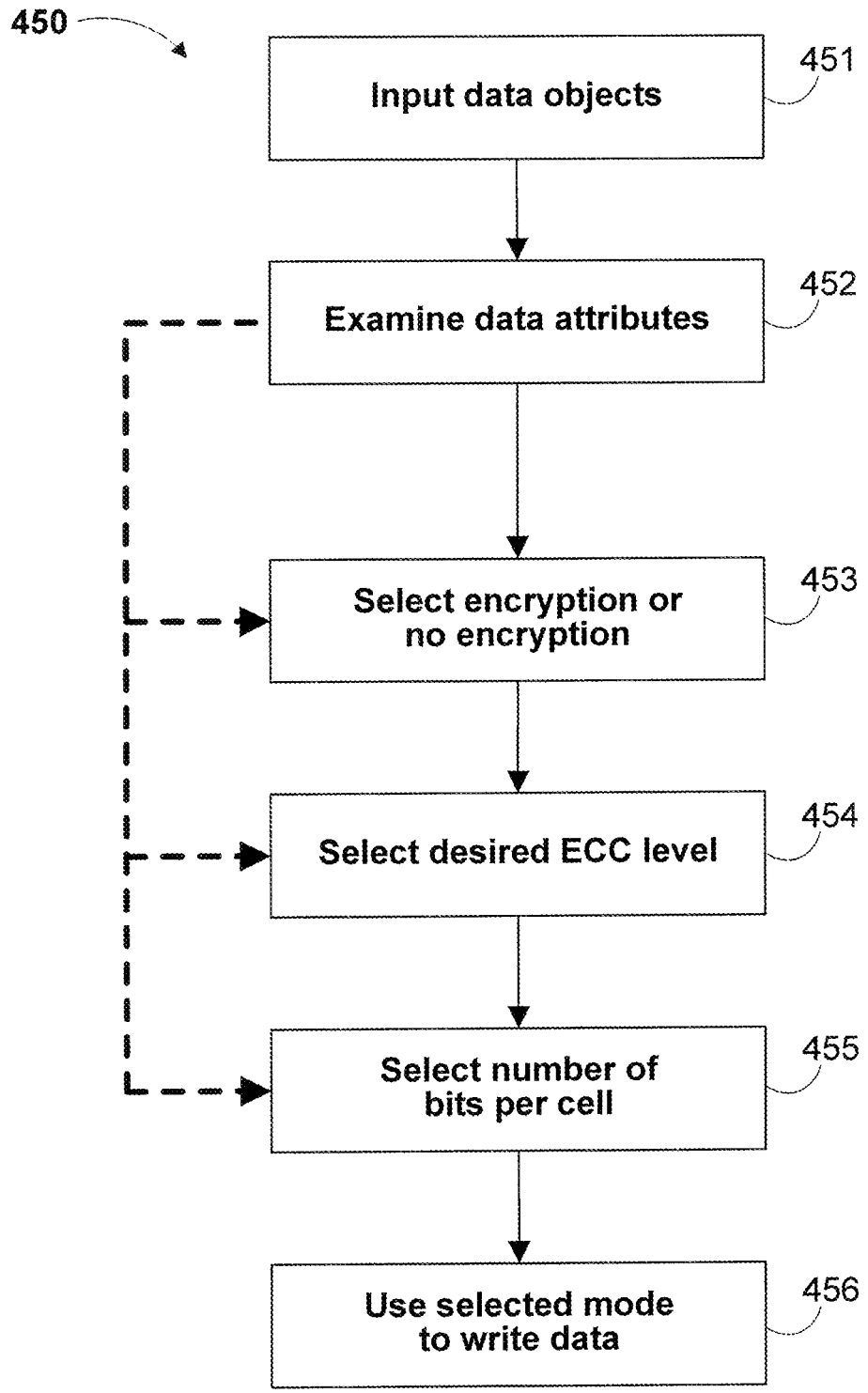
FIG. 6 is a diagram of an exemplary data writing method according to the present invention.

An embodiment of a data-writing method 450 according to the invention is shown in FIG. 6. The data objects to be written are input at step 451. At step 452, the attributes of the data objects are examined and as a result, selections are made between encryption and non-encryption at step 453, between different ECC parity levels at step 454, and between different numbers of bits per cell at step 455. At step 456, the actual writing occurs based on the mode selections.

Figure 7:
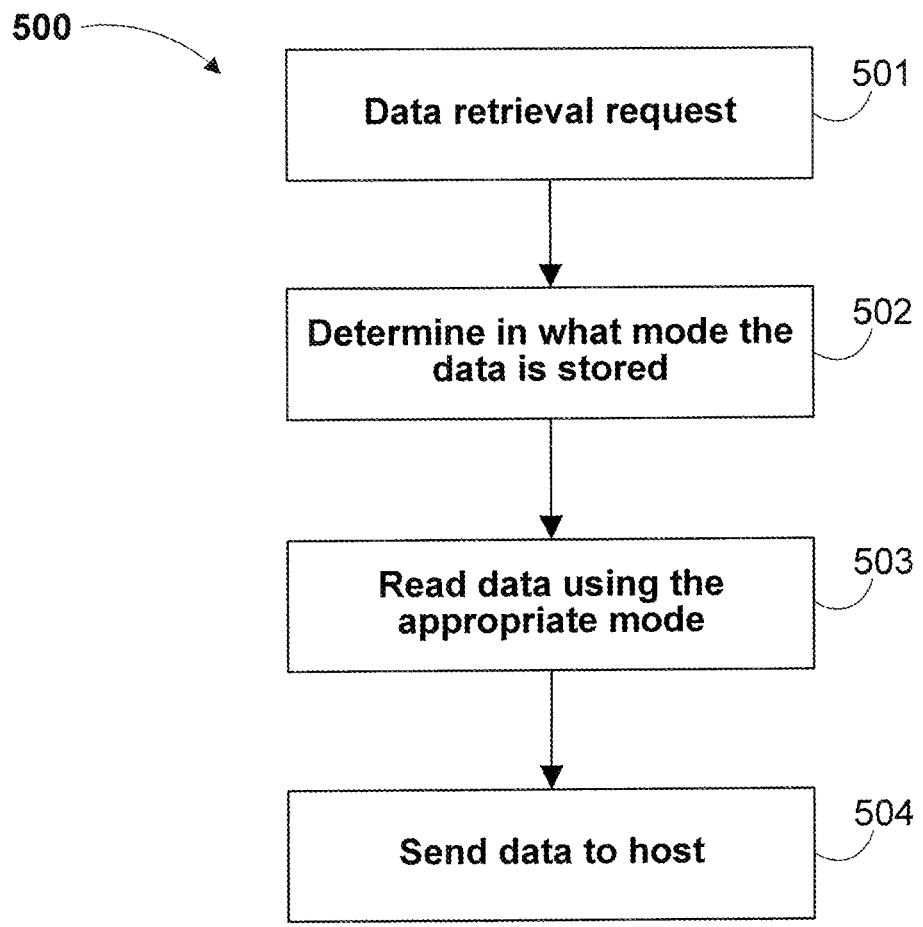
FIG. 7 is a diagram of an exemplary data reading method according to the present invention.

An embodiment of a data-reading method 500 according to the invention is shown in FIG. 7. At step 501, a data read/retrieval request is received from the host system. At step 502, the memory device determines the mode(s) in which the requested data are stored. As discussed above, this may involve a look-up table, or that information may be stored in a predetermined format as a header at the storage address, or that information can be provided along with the request itself. At step 503, the data are read using the appropriate mode(s), and at step 504, the data are sent to the host system.

Figure 8:
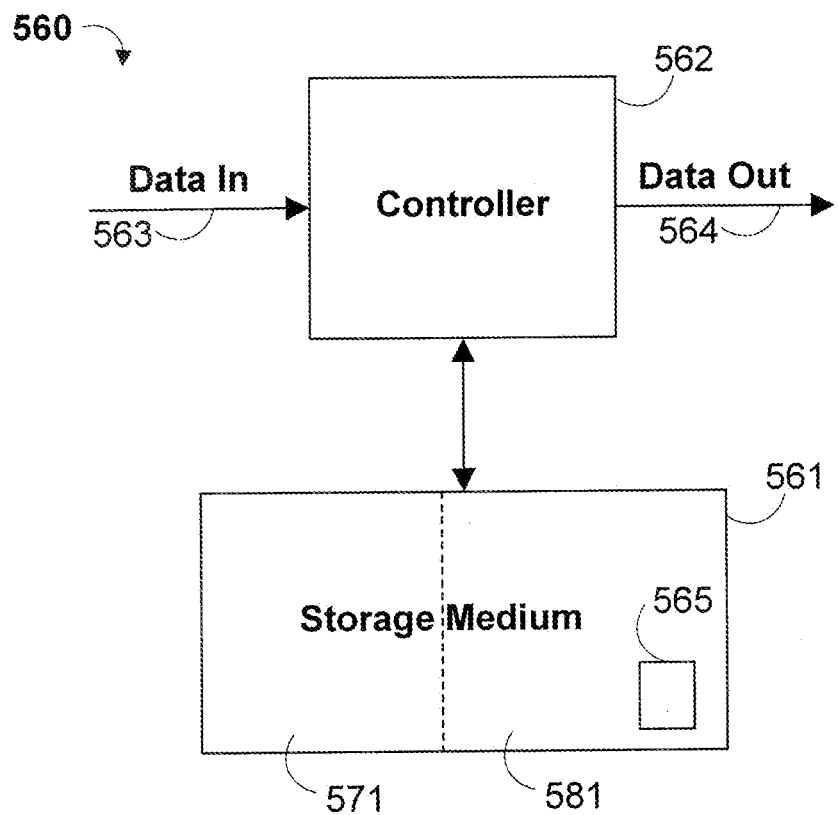
FIG. 8 is a diagram of an exemplary data storage system according to the present invention.

A hardware system 560 embodying the claimed invention is shown in FIG. 8. System 560 includes a storage medium 561 and a controller 562. Storage medium 561 may be the multi-level flash memory described above or any other suitable storage medium. Controller 562 examines data objects input at 563 to determine their attributes and thereby control the operating mode of storage medium 561 when the data objects are written. In some embodiments, storage medium 561 may be partitioned into regions 571, 581 where data having different attributes may be stored, as described above. Similarly, when controller 562 receives a request to read data at an address input at 564, controller 562 reads the attributes of the stored data (which may be in look-up table 565 stored somewhere in storage medium 561 or elsewhere, or may be in a header of the data object itself, or may be embedded with the request itself) and determines the correct mode for reading the data from storage medium 561.

Thus it is seen that a memory system, and method of operating memory, which allow storage of data in different modes according to data object attributes, with a possible trade-off of data storage capacity, has been provided.

Referring now to FIGS. 9-15, exemplary implementations of the present invention are shown.

Figure 9:
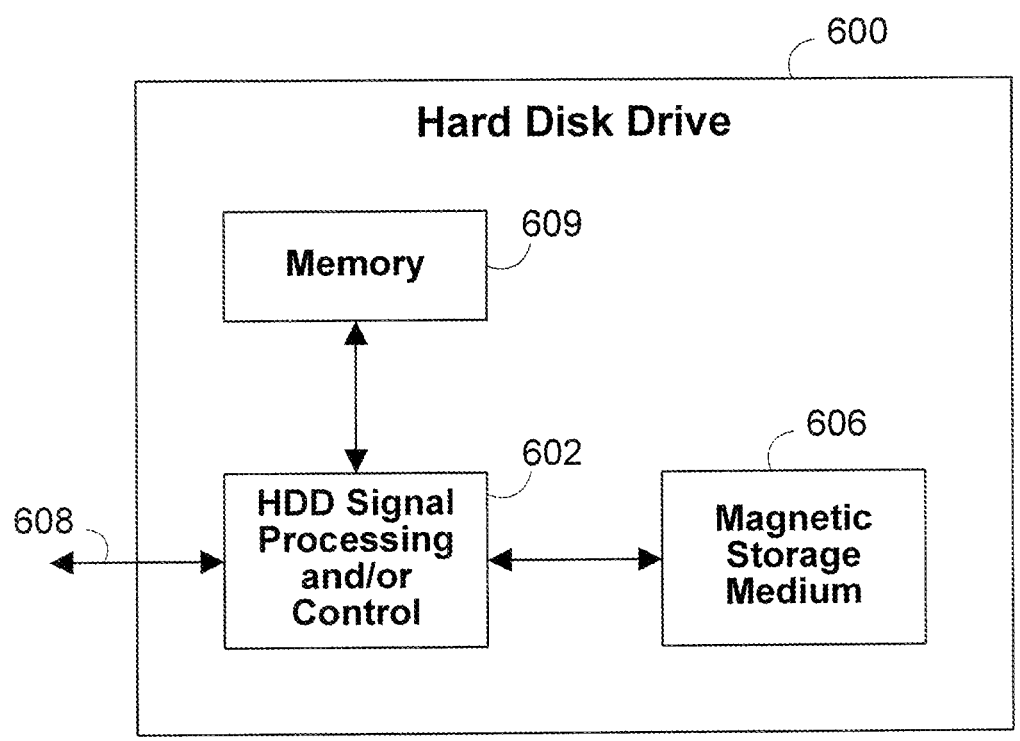
FIG. 9 is a block diagram of an exemplary hard disk drive that can employ the disclosed technology.

Referring now to FIG. 9 the present invention can be implemented in a hard disk drive 600. The present invention may implement either or both signal processing and/or control circuits, which are generally identified in FIG. 9 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 10:
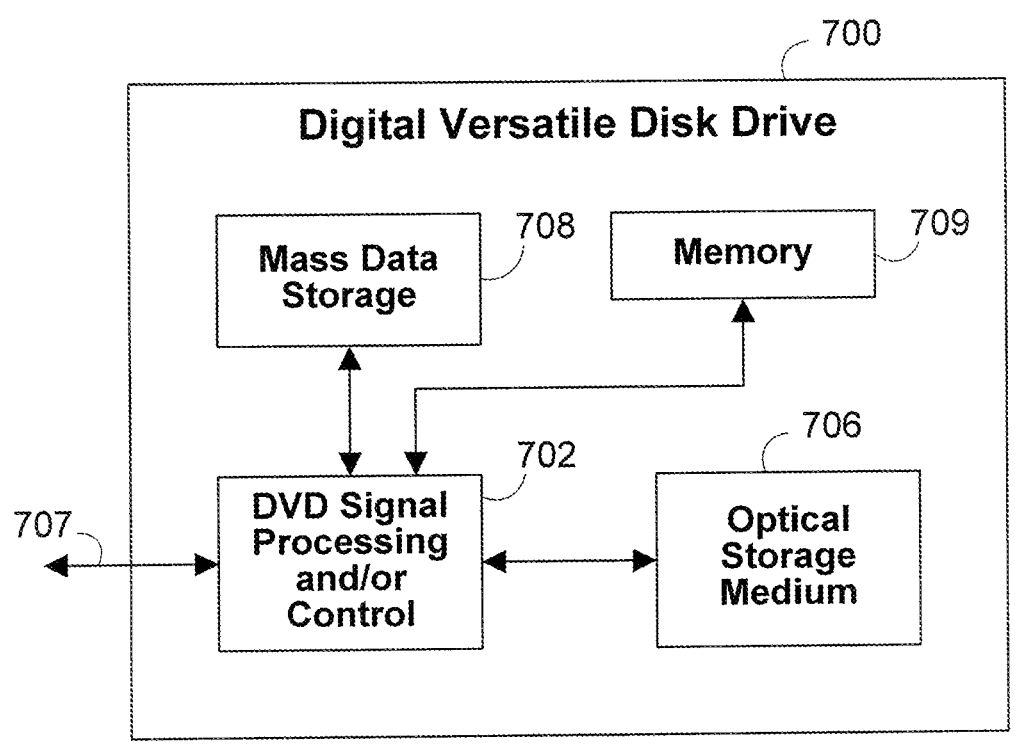
FIG. 10 is a block diagram of an exemplary digital versatile disk drive that can employ the disclosed technology.

Referring now to FIG. 10 the present invention can be implemented in a digital versatile disk (DVD) drive 700. The present invention may implement either or both signal processing and/or control circuits, which are generally identified in FIG. 10 at 702, and/or mass data storage of the DVD drive 700. The signal processing and/or control circuit 702 and/or other circuits (not shown) in the DVD drive 700 may process data, perform coding and/or encryption, perform calculations, and/or format data that is read from and/or data written to an optical storage medium 706. In some implementations, the signal processing and/or control circuit 702 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 707. The DVD drive 700 may communicate with mass data storage 708 that stores data in a nonvolatile manner. The mass data storage 708 may include a hard disk drive (HDD). The HDD may have the configuration shown in FIG. 9 The HDD may be a mini-HDD that includes one or more platters having a diameter that is smaller than approximately 1.8". The DVD drive 700 may be connected to memory 709 such as RAM, ROM, low-latency nonvolatile memory such as flash memory, and/or other suitable electronic data storage.

Figure 11:
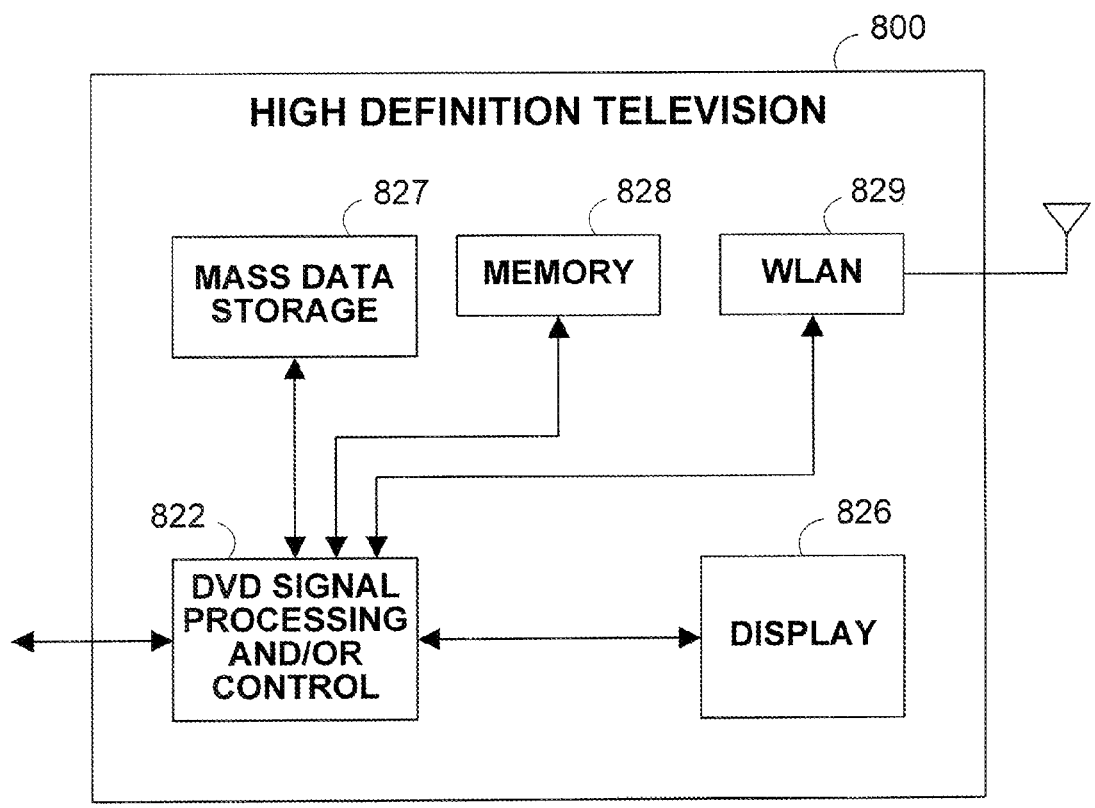
FIG. 11 is a block diagram of an exemplary high definition television that can employ the disclosed technology.

Referring now to FIG. 11, the present invention can be implemented in a high definition television (HDTV) 800. The present invention may implement either or both signal processing and/or control circuits, which are generally identified in FIG. 11 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 800 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one HDD may have the configuration shown in FIG. 9 and/or at least one DVD drive may have the configuration shown in FIG. 10. The HDD may be a mini-HDD that includes one or more platters having a diameter that is smaller than approximately 1.8". The HDTV 800 may be connected to memory 828 such as RAM, ROM, low-latency nonvolatile memory such as flash memory, and/or other suitable electronic data storage. The HDTV 800 also may support connections with a WLAN via a WLAN network interface 829.

Figure 12:
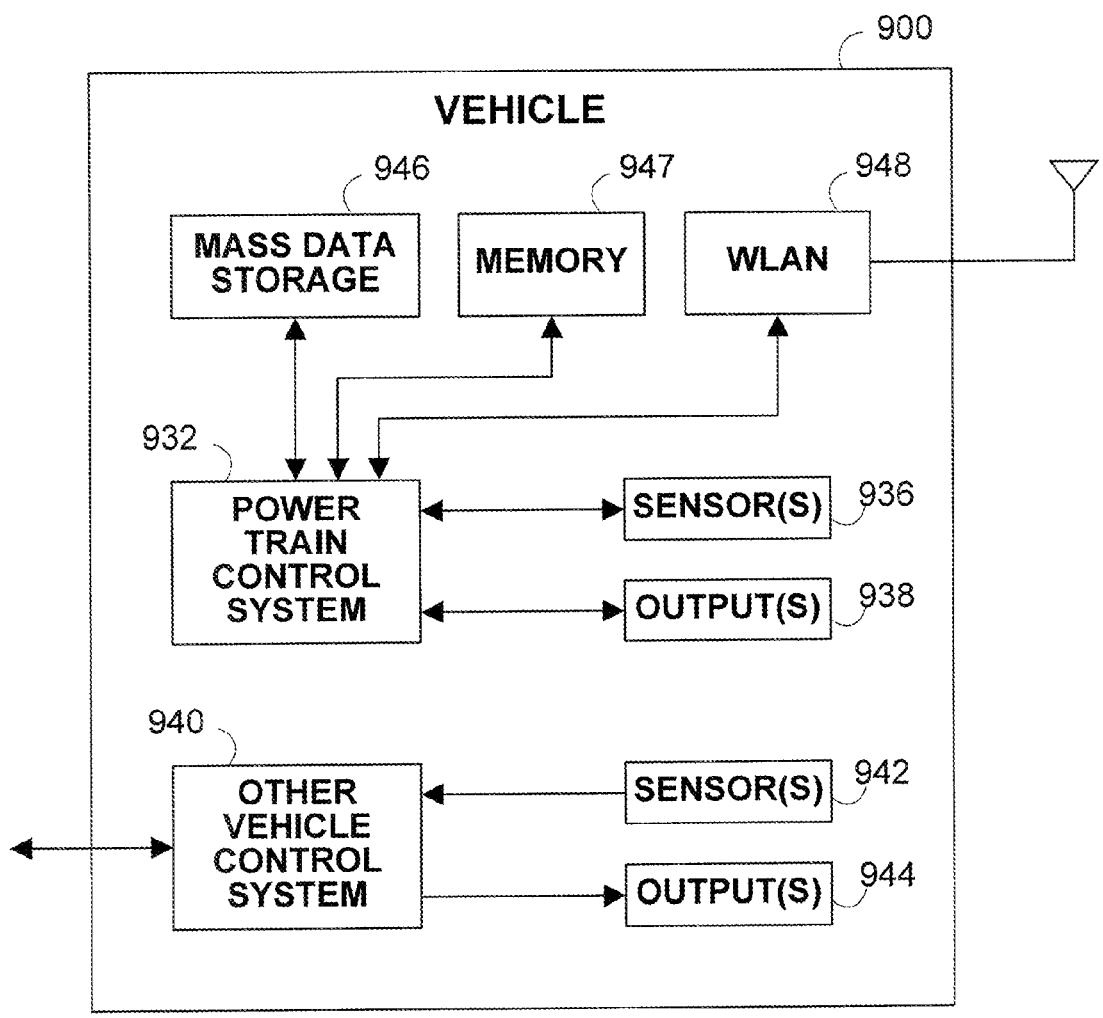
FIG. 12 is a block diagram of an exemplary vehicle that can employ the disclosed technology.

Referring now to FIG. 12, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one HDD may have the configuration shown in FIG. 9 and/or at least one DVD drive may have the configuration shown in FIG. 10. The HDD may be a mini-HDD that includes one or more platters having a diameter that is smaller than approximately 1.8". The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 13:
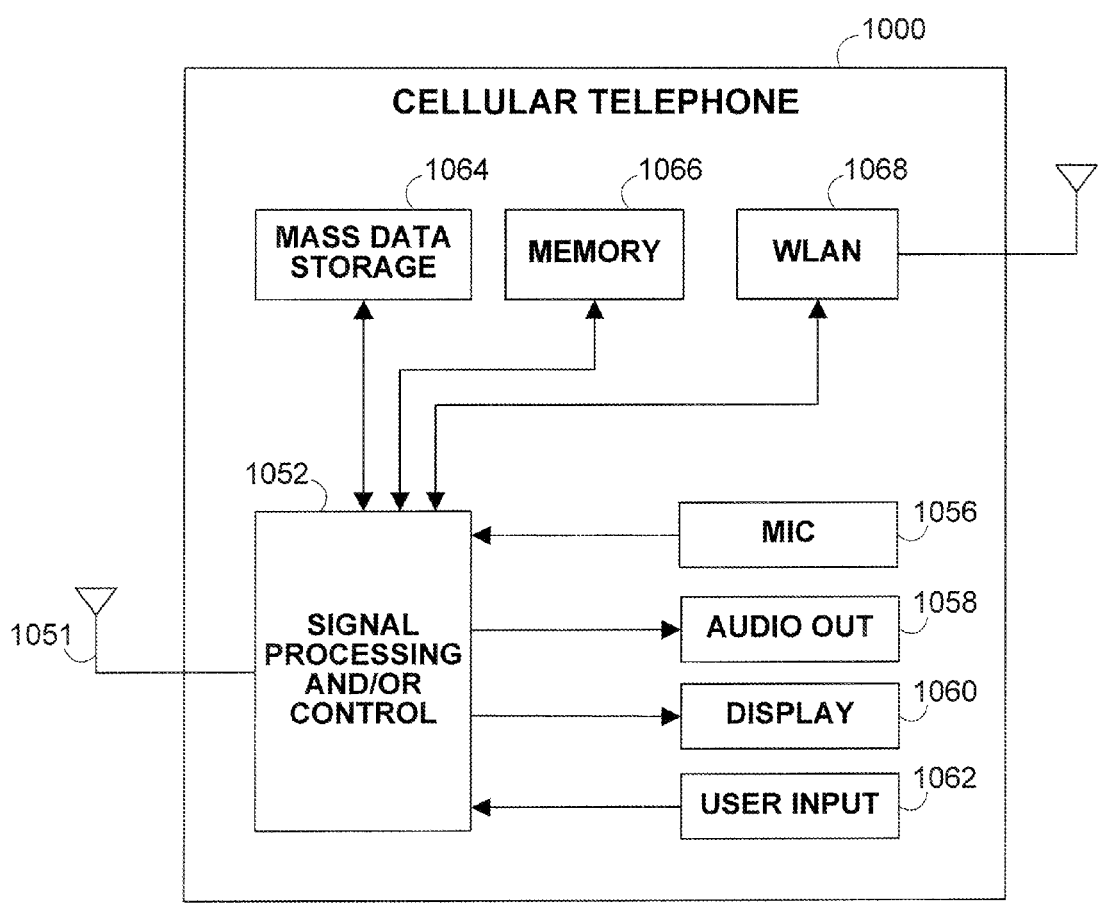
FIG. 13 is a block diagram of an exemplary cellular telephone that can employ the disclosed technology.

Referring now to FIG. 13, the present invention can be implemented in a cellular telephone 1000 that may include a cellular antenna 1051. The present invention may implement either or both signal processing and/or control circuits, which are generally identified in FIG. 13 at 1052, a WLAN interface and/or mass data storage of the cellular phone 1000. In some implementations, the cellular telephone 1000 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1000 may process data, perform coding and/or encryption, perform calculations, format data and/or perform other cellular telephone functions.

The cellular telephone 1000 may communicate with mass data storage 1064 that stores data in a nonvolatile manner such as optical and/or magnetic storage devices—for example hard disk drives (HDDs) and/or DVDs. At least one HDD may have the configuration shown in FIG. 9 and/or at least one DVD drive may have the configuration shown in FIG. 10. The HDD may be a mini-HDD that includes one or more platters having a diameter that is smaller than approximately 1.8". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 14:
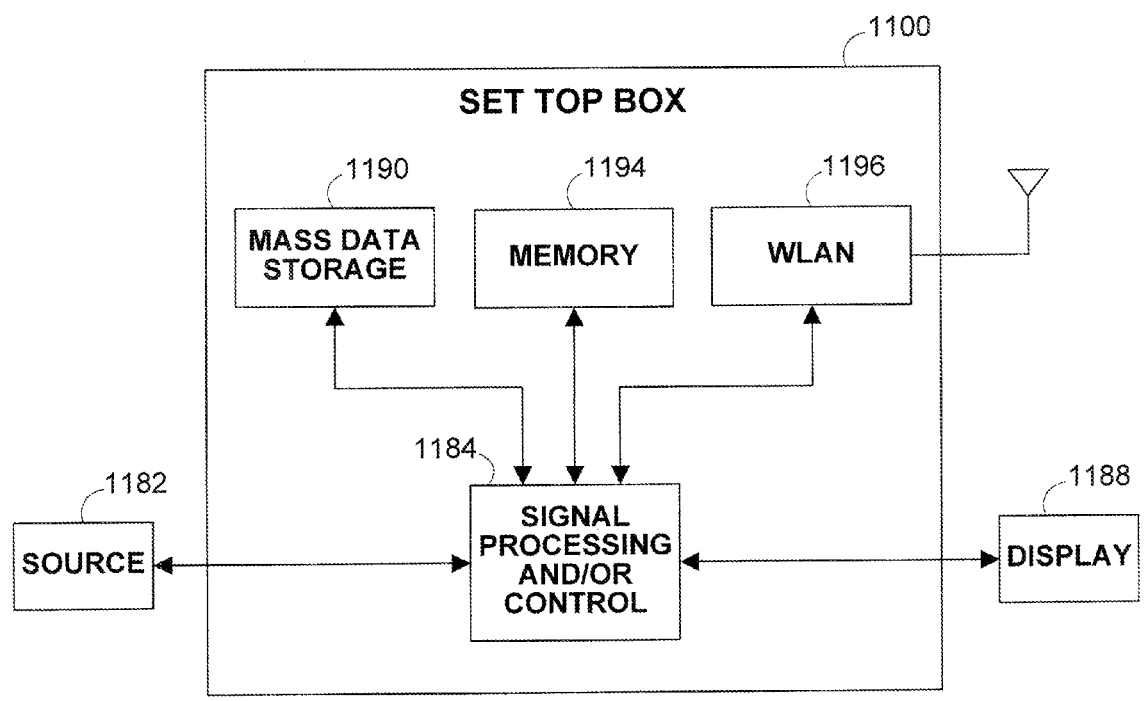
FIG. 14 is a block diagram of an exemplary set top box that can employ the disclosed technology.

Referring now to FIG. 14, the present invention can be implemented in a set top box 1100. The present invention may implement either or both signal processing and/or control circuits, which are generally identified in FIG. 14 at 1184, a WLAN interface and/or mass data storage of the set top box 1100. Set top box 1100 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1100 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 9 and/or at least one DVD drive may have the configuration shown in FIG. 10. The HDD may be a mini-HDD that includes one or more platters having a diameter that is smaller than approximately 1.8". Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 15:
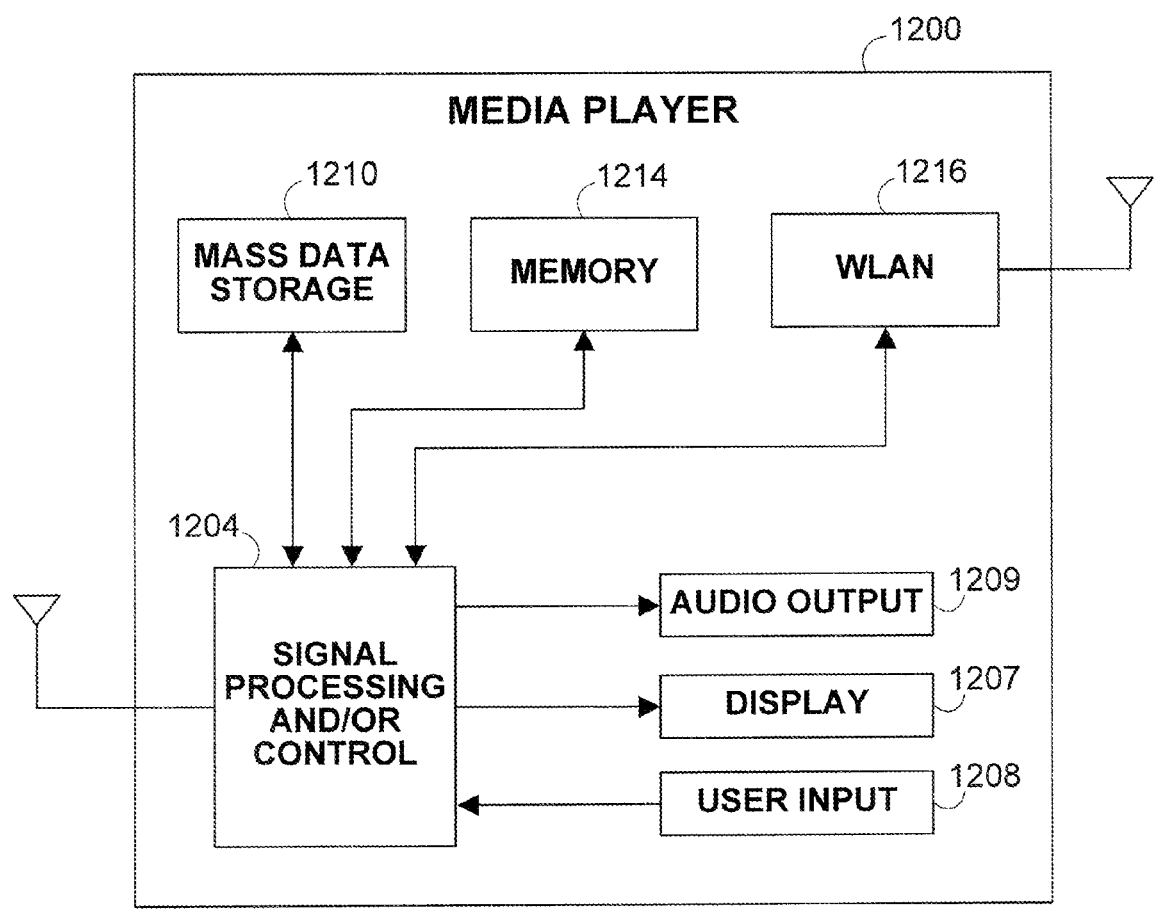
FIG. 15 is a block diagram of an exemplary media player that can employ the disclosed technology.

Referring now to FIG. 15, the present invention can be implemented in a media player 1200. The present invention may implement either or both signal processing and/or control circuits, which are generally identified in FIG. 15 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 9 and/or at least one DVD drive may have the configuration shown in FIG. 10. The HDD may be a mini-HDD that includes one or more platters having a diameter that is smaller than approximately 1.8". Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for storing data in a storage device which is a hybrid device comprising a single-level memory cell array and a multi-level memory cell array, the method comprising:
   determining one or more attributes associated with each of a plurality of data objects; and
   selectively operating respective designated portions of the storage device in respective ones of a plurality of operating modes to process each of the plurality of data objects based on a corresponding one or more attributes;
   wherein:
   the single-level memory cell array is the respective designated portion for data object having a first one or more attributes; and
   the multi-level memory cell array is the respective designated portion for data objects having a second one or more attributes.

2. The method of claim 1 wherein the respective designated portions comprise designated memory pages.

3. The method of claim 2 wherein:
   most-significant-bit memory pages are used for a first one or more attributes; and
   least-significant-bit memory pages are used for second one or more attributes.

4. The method of claim 1 wherein the single-level memory cell array is the respective designated portion for critical data and the multi-level memory cell array is the respective designated portion for non-critical data.

5. The method of claim 1 wherein the single-level memory cell array is the respective designated portion for streaming media data and the multi-level memory cell array is the respective designated portion for non-streaming media data.

6. The method of claim 1 wherein:
   the data include a first data portion with a first read or write speed requirement and a second data portion with a second read or write speed requirement slower than the first read or write speed requirement;
   the single-level memory cell array is the respective designated portion for the first data portion and the multi-level memory cell array is the respective designated portion for the second data portion.

7. A memory device, the memory device being a hybrid device, comprising:
   a storage medium having respective portions designated to operate in respective ones of a plurality of operating modes, comprising a single-level memory cell array and a multi-level memory cell array; and
   a controller for examining one or more attributes of a data object to be stored and for writing the data object to one of the respective portions of the storage medium in one of the modes according to the one or more attributes; wherein:
the single-level memory cell array is the respective designated portion for data object having a first one or more attributes; and
the multi-level memory cell array is the respective designated portion for data objects having a second one or more attributes.

8. The memory device of claim 7 wherein:
the respective portions designated to operate comprise designated memory pages.

9. The memory device of claim 8 wherein:
most-significant-bit memory pages are used for a first one or more attributes; and
least-significant-bit memory pages are used for second one or more attributes.

10. The memory device of claim 7 wherein the single-level memory cell array is the respective portion designated to operate for critical data and the multi-level memory cell array is the respective portion designated to operate for non-critical data.

11. The memory device of claim 7 wherein the single-level memory cell array is the respective portion designated to operate for streaming media data and the multi-level memory cell array is the respective portion designated to operate for non-streaming media data.

12. The memory device of claim 7 wherein:
the data include a first data portion with a first read or write speed requirement and a second data portion with a second read or write speed requirement slower than the first read or write speed requirement;
the single-level memory cell array is used for the first data portion and the multi-level memory cell array is used for the second data portion.

* * * * *